(12) United States Patent
Nakano et al.

(10) Patent No.: US 11,286,554 B2
(45) Date of Patent: Mar. 29, 2022

(54) SPUTTERING APPARATUS

(71) Applicant: ULVAC, INC., Kanagawa (JP)

(72) Inventors: Katsuaki Nakano, Kanagawa (JP);
Kanji Yaginuma, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 9 days.

(21) Appl. No.: 16/621,340

(22) PCT Filed: Jun. 25, 2018

(86) PCT No.: PCT/JP2018/024020
§ 371 (c)(1),
(2) Date: Dec. 11, 2019

(87) PCT Pub. No.: WO2019/049472
PCT Pub. Date: Mar. 14, 2019

(65) Prior Publication Data
US 2021/0140033 A1 May 13, 2021

(30) Foreign Application Priority Data
Sep. 7, 2017 (JP) .............................. JP2017-172487

(51) Int. Cl.
*C23C 14/35* (2006.01)
*C23C 14/04* (2006.01)
*C23C 14/50* (2006.01)

(52) U.S. Cl.
CPC .............. *C23C 14/35* (2013.01); *C23C 14/04* (2013.01); *C23C 14/505* (2013.01)

(58) Field of Classification Search
CPC ........ C23C 14/35; C23C 14/04; C23C 14/505
See application file for complete search history.

(56) References Cited

U.S. PATENT DOCUMENTS 6,398,929 B1 * 6/2002 Chiang ................. C23C 14/046
204/298.11
2002/0023831 A1 * 2/2002 Iwase ................. H01J 37/3447
204/192.12

(Continued)

FOREIGN PATENT DOCUMENTS

JP 60-131966 A 7/1985
JP 9-213634 A 8/1997

(Continued)

OTHER PUBLICATIONS

JP-09213634-A Translation (Year: 1997).*

(Continued)

*Primary Examiner* — Jennifer Wecker
*Assistant Examiner* — Patrick S Ott
(74) *Attorney, Agent, or Firm* — Cermak Nakajima & McGowan LLP; Tomoko Nakajima

(57) ABSTRACT

The sputtering apparatus has a vacuum chamber in which is disposed a target. While rotating a circular substrate at a predetermined rotational speed with a center of the substrate, the target is sputtered to form the thin film on the surface. The sputtering apparatus has: a stage for rotatably holding the substrate in a state in which the center of the substrate is offset by a predetermined distance to radially one side from the center of the target; and a shielding plate disposed between the target and the substrate on the stage. The shielding plate has an opening part allowing to pass sputtered particles scattered out of the target as a result of sputtering the target. The opening part has a contour in which, with a central region of the substrate serving as an origin, the area of the opening part gradually increases from the origin toward radially outward.

7 Claims, 3 Drawing Sheets

(56) References Cited

U.S. PATENT DOCUMENTS

| | | | |
|---|---|---|---|
| 2002/0162740 A1* | 11/2002 | Wang | B01J 19/122 204/298.11 |
| 2004/0003771 A1* | 1/2004 | Rich | H01J 37/3455 117/88 |
| 2007/0095650 A1* | 5/2007 | Ye | H01J 37/3455 204/192.1 |
| 2011/0203734 A1* | 8/2011 | Koji | H01J 37/3402 156/345.24 |
| 2015/0101927 A1* | 4/2015 | Yamaguchi | C23C 14/3492 204/298.12 |

FOREIGN PATENT DOCUMENTS

| | | | | |
|---|---|---|---|---|
| JP | 09213634 | A | * | 8/1997 |
| JP | 2006037209 | A | * | 2/2006 |
| JP | 2006-104525 | A | | 4/2006 |
| JP | 2006104525 | A | * | 4/2006 |
| JP | 2010-138423 | A | | 6/2010 |
| JP | 2016-047940 | A | | 4/2016 |
| JP | 2016047940 | A | * | 4/2016 |

OTHER PUBLICATIONS

JP-2016047940-A Translation (Year: 2016).*
JP-2006037209-A Translation (Year: 2006).*
JP-2006104525-A Translation (Year: 2006).*
International Search Report for PCT Patent App. No. PCT/JP2018/024020 (dated Aug. 28, 2018).

* cited by examiner

FIG.3(a)

| 2r=300mm,Vo=r/2.66 | CENTRAL ANGLE $\theta$ (°) | | | | | |
|---|---|---|---|---|---|---|
| T/S DISTANCE d1(mm) | 45 | 60 | 90 | 120 | 150 | 180 |
| 200 | ○ | ○ | ○ | × | × | × |
| 300 | △ | ○ | ○ | ○ | × | × |
| 400 | △ | ○ | ○ | ○ | ▲ | ▲ |

FIG.3(b)

| 2r=450mm,Vo=r/2.66 | CENTRAL ANGLE $\theta$ (°) | | | | | |
|---|---|---|---|---|---|---|
| T/S DISTANCE d1(mm) | 45 | 60 | 90 | 120 | 150 | 180 |
| 200 | ○ | ○ | × | × | × | × |
| 300 | △ | ○ | ○ | × | × | × |
| 400 | △ | ○ | ○ | ○ | × | × |
| 600 | △ | ○ | ○ | ○ | ▲ | ▲ |

SPUTTERING APPARATUS

This application is a national phase entry under 35 U.S.C. § 371 of PCT Patent Application No. PCT/JP2018/024020, filed on Jun. 25, 2018, which claims priority under 35 U.S.C. § 119 to Japanese Patent Application No. 2017-172487, filed Sep. 7, 2017, both of which are incorporated by reference.

TECHNICAL FIELD

The present invention relates to a sputtering apparatus for forming thin films such as barrier films, seed layers, and the like on the inside of holes and trenches formed on surfaces of substrates in the step of manufacturing semiconductor devices and relates, in particular, to a sputtering apparatus suitable for forming thin films on bottom surfaces and side surfaces of the holes and trenches with good coverage and in good symmetry relative to the holes and trenches (i.e., in such a manner that the film thicknesses of the thin films formed on the opposite side surfaces of the holes and trenches become equal to each other).

BACKGROUND ART

As an ordinary sputtering apparatus, in order to obtain good in-plane uniformity of the substrate, there is known one which is provided with: a vacuum chamber in which a target is disposed; and a stage for rotatably holding a circular substrate which is disposed inside the vacuum chamber so as to lie opposite to the target. While rotating the substrate, with the center thereof serving as the center of rotation, at a predetermined rotational speed, the target is sputtered to thereby form thin films on the surface of the substrate.

In addition, the substrate is rotatably held on the stage in a state in which the center of the substrate is offset, by a predetermined distance, to radially one side from the center of the target, and a shielding plate having a partial opening part is disposed between the target and the substrate. In this manner, by using a relatively small target, films are formed over the entire surface of the relatively large substrate. Such art as mentioned above is shown, e.g., in Patent Document 1.

However, the sputtering apparatus in the above-mentioned prior art has the problems in that: among the sputtered particles scattered from the target, those obliquely incident to the surface of the substrate cannot be sufficiently restrained and consequently that; the lowering of the coverage accompanied by the growth of overhung at the parts of opening the holes, and the asymmetry occur. Thin films cannot therefore be formed on the inside of the holes and trenches with good coverage and symmetry that are required of the film forming on recent fine patterns.

PRIOR ART DOCUMENTS

Patent Documents

Patent Document 1: JP-1997-213634-A

SUMMARY OF THE INVENTION

Problems that the Invention is to Solve

In view of the above points, this invention has a problem of providing a sputtering apparatus which is capable of forming predetermined thin films on the inside of the holes and trenches formed on surfaces of substrates while maintaining good symmetry and also with good coverage.

Means for Solving the Problems

In order to solve the above-mentioned problems, a sputtering apparatus according to this invention has a vacuum chamber in which a target is disposed and, while a circular substrate disposed inside the vacuum chamber, opposite to the target is rotated at a predetermined rotational speed, with a center of the substrate serving as a center of rotation, the target is sputtered, thereby forming a thin film on a surface of the substrate. The sputtering apparatus comprises: a stage for rotatably holding the substrate in a state in which the center of the substrate is offset, relative to the center of the target, by a predetermined distance to radially one side from the center of the target; and a shielding plate disposed between the target and the substrate on the stage in order to cover the substrate. The shielding plate has formed therein an opening part which allows sputtered particles to pass to the side of the substrate, the sputtered particles being scattered out of the target as a result of sputtering the target at a predetermined discharge pressure. The opening part has a contour in which, with a central region of the substrate serving as an origin, the area of the opening part gradually increases from the origin toward radially outward, and an amount of increase in the area of the opening part is set depending on the distance between the target and the substrate.

According to this invention, since the sputtering is performed in a pressure region in which the mean free path of the sputtered particles is long, the sputtered particles advance while keeping the angle at which the sputtered particles got scattered from the target. In the course of their advancing, among the sputtered particles scattered from the target, those obliquely incident to the surface of the substrate will be shielded by the shielding plate. Therefore, thin films can be formed with good coverage on the bottom surfaces and side surfaces of the holes and trenches and, at the same time, thin films can be formed in good symmetry relative to the holes and trenches. Still furthermore, by setting the amount of increase in the area of the opening part depending on the distance between the target and the substrate, a high film-forming rate can be materialized without impairing the function of being capable of forming the predetermined thin films with good coverage while maintaining a good symmetry. By the way, in this invention, in order to obtain good uniformity in the film thicknesses and symmetry of the deposited shapes of the thin films to be formed in the holes and trenches, the diameter of the target shall preferably be set to about 2 times or more of the radius of the substrate.

In this invention, in case the opening part has a contour of a sector, provided a radius of the substrate is defined as r and the distance between the target and the substrate is defined as d, the center of the substrate is preferably offset so as to be away from the center of the target by r/3 or more, and the area of the opening part is preferably set such that a ratio of shielded area of the substrate as shielded by the shielding plate is larger than a value of $1-(d \div 2r/2.66)$. This kind of area of a central angle of the opening part shall preferably be set to a range of 60° to 120°. If the central angle is smaller than 60°, there is a case in which the film-forming rate cannot be increased high enough. On the other hand, if the central angle is larger than 120°, the amount of sputtered particles that are obliquely incident to the surface of the substrate increases, so that there are cases where the symmetry and the coverage sometimes become poor.

By the way, if film formation is performed in a portion around the origin of the opening part, there are cases where the amount of sputtered particles that reach the central region of the substrate decreases. In this case, it may be considered to exchange the shielding plate, but this solution requires that the inside of the vacuum chamber be opened to atmosphere, thereby giving rise to poor productivity. In this invention, by moving the shielding plate along the offset direction of the substrate relative to the center of the target, the amount of sputtered particles that reach the central region of the substrate can be maintained. In this manner, the film thickness of the thin films to be formed in the holes and trenches that are present in the central region can be prevented from getting thinner.

Further, in case there are provided: a magnet unit disposed on that back side of the target which is opposite to the substrate such that leakage magnetic field is generated between the target and the substrate and is also unevenly distributed between the center of the target and a peripheral part of the target; and rotating means for rotating the magnet unit with the center of the target serving as a center of rotation, there are cases of giving rise to a region in which the film formation is not performed with the desired film thickness in the in-plane surface of the substrate if the rotations of the magnet unit and the stage are synchronized with each other. In this invention, by disposing control means for controlling the rotational speeds of the magnet unit and the stage, respectively, so that the rotations of the magnet unit and the stage are not synchronized with each other, it is possible to form films with desired film thicknesses over the entire surface of the substrate.

In this invention, the distance between the shielding plate and the substrate shall preferably be within two times the mean free path at the discharge pressure. If the distance is above two times, due to scattering among the particles themselves, the number of particles obliquely incident to the surface of the substrate will increase. Therefore, there is a disadvantage in that the films adhered to the opening parts of the holes and trenches are likely to cause overhang.

In this invention, preferably the opening part of the shielding plate has kept exposed the central region of the substrate. According to this arrangement, by providing the opening part right above the center of the substrate, the film thicknesses of the thin films to be formed in the holes and trenches that are present in the central region of the substrate will not become thinner, but the coverage in the central region of the substrate can be made good.

BRIEF DESCRIPTION OF THE DRAWINGS

FIG. 3 is a graph showing the results of experiments to confirm the effects of this invention.

MODES FOR CARRYING OUT THE INVENTION

With reference to the drawings, a description will now be made of a sputtering apparatus according to an embodiment of this invention. In the following, with FIG. 1 serving as a basis, a description will be made provided that the side of a ceiling part of the vacuum chamber is defined as "upper (side)" and the side of the bottom part thereof is defined as "lower (side)".

Figure 1:
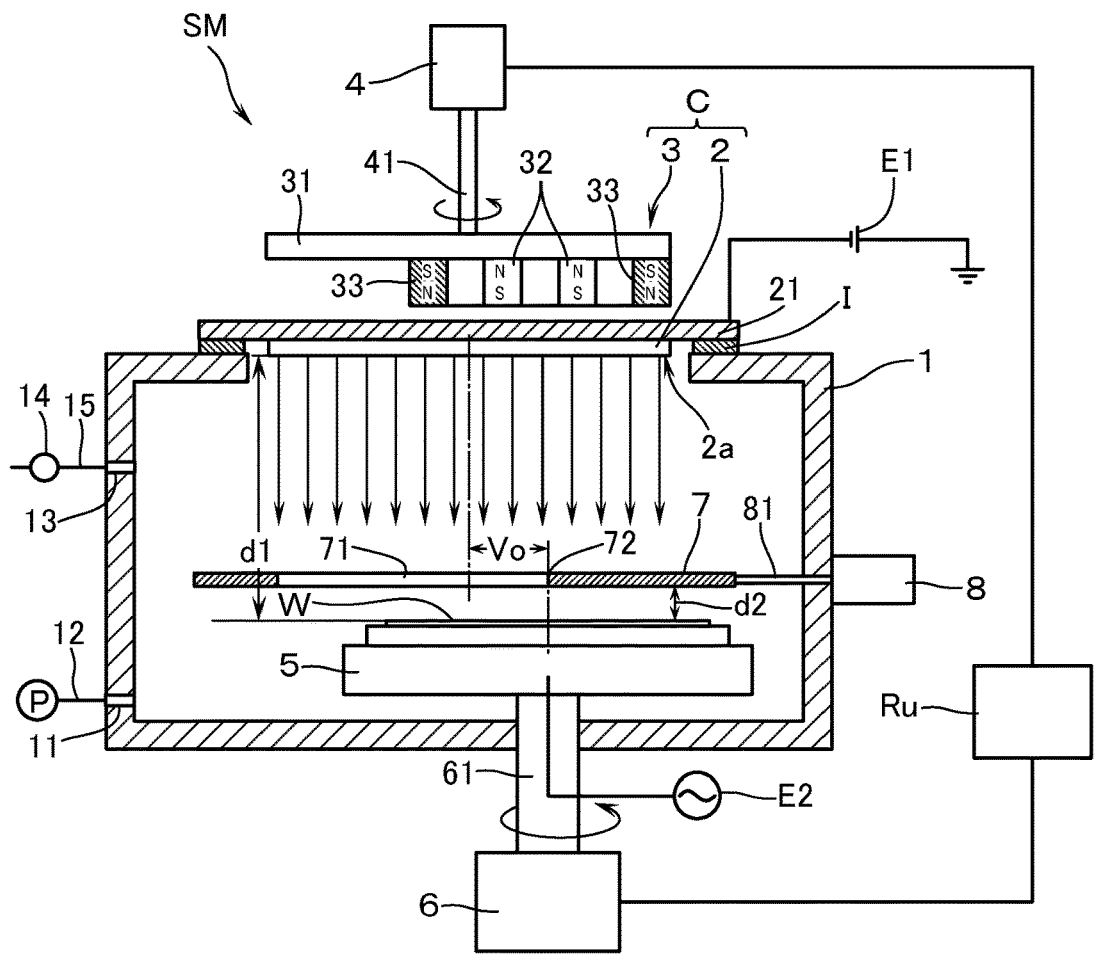
FIG. 1 is a schematic sectional view showing a magnetron sputtering apparatus according to an embodiment of this invention.

As shown in FIG. 1, the sputtering apparatus SM is provided with a vacuum chamber 1 which defines a processing chamber 1a. A side wall of the vacuum chamber 1 is provided with an exhaust port 11. This exhaust port 11 has connected thereto, through an exhaust pipe 12, a vacuum pump P which is made up of a turbo molecular pump, rotary pump, and the like so that the processing chamber 1a can be evacuated to a predetermined pressure (e.g., $1 \times 10^{-5}$ Pa). The side wall of the vacuum chamber 1 is provided with a gas introduction port 13. This gas introduction port 13 is in communication with a gas source (not illustrated), and has connected thereto a gas pipe 15 having interposed therein a mass flow controller 14 so that sputtering gas including rare gas such as Ar and the like can be introduced into the processing chamber 1a at a predetermined flow rate.

The vacuum chamber 1 has on its ceiling part a cathode unit C in a manner detachable at will. The cathode unit C is constituted by: a target 2 which is disposed in a manner to face the inside of the vacuum chamber 1 (processing chamber 1a); and a magnet unit 3 disposed on that back side of the target 2 which is opposite to the sputtering surface 2a such that leakage magnetic field is generated between the target 2 and the substrate W and is also unevenly distributed between the center of the target 2 and a peripheral part of the target 2. The target 2 is made of a material such as metal, metallic compound (electrical insulating material), and the like to be appropriately selected depending on the composition of the thin film to be formed, and is manufactured by using a known method so as to have a contour, e.g., of a circle. The target 2 has connected thereto an output having a negative electric potential from a DC power source or a radio frequency power source as a sputtering power source E so that electric power is applied at the time of sputtering. To that surface of the target 2 which lies opposite to the sputtering surface 2a, a backing plate 21 is bonded through a bonding material such as indium, tin, and the like. The backing plate 21 is made of a metal such as Cu, and the like which has good thermal conductivity. By circulating a cooling medium through a cooling medium circulation passage (not illustrated), the target 2 is arranged to be cooled. As the magnet unit 3, there can be used a known one made up of; a plate-shaped yoke 31 made of a magnetic material; a plurality of first magnets 32 of the same magnetization, that are arrayed into an annular shape on the lower surface of the yoke 31; and a plurality of second magnets 33 that are of the same magnetization as the first magnets 32 and that are arrayed to enclose the circumference of the first magnets 32. To the upper surface of the yoke 31, there is connected a rotary shaft 41 of rotating means 4 so that, during the time in which the target 2 is sputtered to thereby form a film, the magnet unit 3 is arranged to be rotatable with the center of the target 2 serving as a center of rotation.

At the bottom part of the vacuum chamber 1, there is provided a stage 5 for holding a substrate W in a state of being radially offset in one direction by a predetermined distance from the center of the target 2. To the center of the lower surface of the stage 5, there is connected a rotary shaft 61 of rotating means 6 which penetrates a bottom wall of the vacuum chamber 1 through a vacuum sealing material (not illustrated) so that the substrate W can be rotated at a predetermined rotational speed. The stage 5 has connected thereto an output of high-frequency power source as a bias power source E2 so that bias power is applied at the time of sputtering. By the way, the stage 5 has a known electrostatic chuck (not illustrated) so that, by charging electrodes of this electrostatic chuck with a predetermined voltage, the substrate W is arranged to be sucked and held on the stage 5 with the film-forming surface facing upward. Further, an arrangement may also be made that a driving shaft of lifting means (not illustrated) is connected to the stage 5 so that the distance between the target 2 and the substrate W can be varied.

Figure 2:
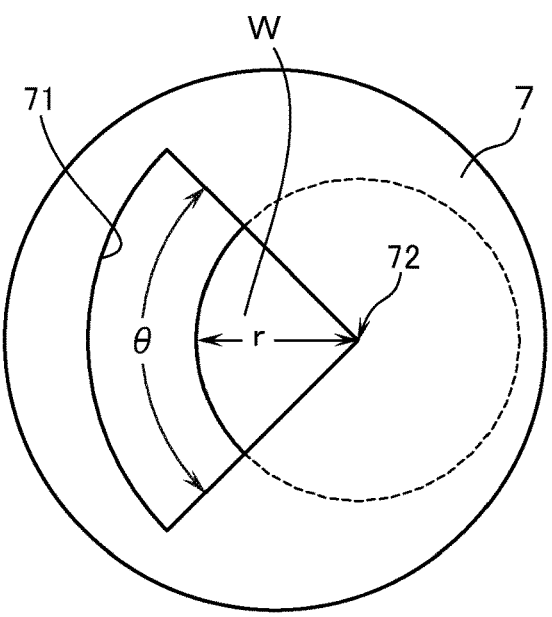
FIG. 2 is a schematic plan view of a shielding plate shown in FIG. 1.

Between the target 2 and the substrate W on the stage 5, there is disposed a shielding plate 7 which covers the substrate W. The shielding plate 7 has formed therein an opening part 71 which allows the sputtered particles scattered from the target 2 to pass to the side of the substrate W. With reference also to FIG. 2, the opening part 71 has kept exposed, for example, the central region of the substrate W, and has a contour in which, with the portion having the central region exposed serving as an origin 72, the area of the opening part gradually increases toward the radially outward from the origin. The amount of increase in the opening area is set depending on the distance d1 between the target 2 and the substrate W. The distance d2 between the substrate W and the shielding plate 7 shall preferably be set to a range of 5 to 100 mm. In particular, when taking into consideration the phenomena that the sputtered particles after having passed through the opening part 71 of the shielding plate 7 collide with other particles and change their travelling directions, the distance d2 between the substrate W and the shielding plate 7 shall preferably be set to within two times the mean free path relative to the discharge pressure. In addition, to the side surface of the shielding plate 7, there is connected a drive shaft 81 of the moving means 8. In this manner, the shielding plate 7 is arranged to be moveable along the offset direction of the substrate W (i.e., in the right-and-left direction in FIG. 1) relative to the center of the target 2.

The above-mentioned sputtering apparatus SM has known control means Ru equipped with microcomputer, sequencer, and the like so as to perform overall control over the operation of the vacuum pump P, operation of the mass flow controller 14, operation of the sputtering power source E, operation of the rotating means 4, operation of the rotating means 6, operation of the moving means 8, and the like. By the way, if the rotations of the magnet unit 3 and the stage 5 are synchronized with each other, there are cases of giving rise to regions where the films are not formed in the desired thicknesses in the in-plane surface of the substrate W. Then, by controlling, with the control means Ru, the rotational speeds of the magnet unit 3 and the stage 5 respectively so that the rotational speeds of the magnet unit 3 and the stage 5 are not synchronized with each other, film formation can be performed at desired film thicknesses over the entire surface of the substrate W. A description will now be made of the method of forming films using the above-mentioned sputtering apparatus SM in an example of forming Cu films on the inside of the holes and trenches (not illustrated) formed on the surface of the substrate W.

The inside of the vacuum chamber 1, in which a target 2 made of Cu is disposed, is evacuated to a predetermined vacuum degree (e.g., $1 \times 10^{-5}$ Pa). By a transfer robot (not illustrated) a substrate W is transferred to the inside of the vacuum chamber 1. The substrate W is handed over to the stage 5, and the substrate W is electrostatically sucked to the upper surface of the stage 5 and is held. Then, by the rotating means 6 the stage 5 is rotated in a predetermined rotational speed (e.g., 120 rpm), thereby rotating the substrate W. Together with the above, while rotating the magnet unit 3 at a predetermined rotational speed (e.g., 52 rpm) by the rotating means 4, argon gas as a sputtering gas is introduced at a flow rate of, e.g., 0-20 sccm (the pressure inside the vacuum chamber 1 at this time is below $2.0 \times 10^{-1}$ Pa). By charging DC power (e.g., 10 to 30 kW) from the sputtering power source E1 to the target 2, and by charging high-frequency power, e.g., of 300 W at 13.56 MHz from the bias power source E2 to the stage 5, plasma is formed inside the vacuum chamber 1. According to this arrangement, the sputtering surface 2a of the target 2 is caused to be sputtered. The sputtered particles scattered from the target 2 pass through the opening part 71 of the shielding plate 7 and get adhered and deposited on the bottom surfaces and side surfaces of the holes and trenches formed in the surface of the substrate W, thereby forming Cu films.

At this time, among the sputtered particles scattered from the target 2, since the scattered particles obliquely incident to the surface of the substrate W will be shielded by the shielding plate 7, in other word, since the sputtered particles that pass through the opening part 71 of the shielding plate 71 will be incident to the surface of the substrate W substantially vertically, the Cu films can be formed in good symmetry and with good coverage relative to the holes and trenches. In addition, the shielding plate 7 shall preferably be disposed such that the opening part 71 of the shielding plate 7 is present right above the central region of the substrate W. In this case, there is no possibility that the sputtered particles that reach the central region of the substrate W get smaller in amount. Therefore, the film thicknesses of the Cu films to be formed in the holes and trenches that are present in the central region of the substrate W will not become locally thinner. Instead, it becomes possible to form Cu films having substantially equal film thicknesses over the entire surface of the substrate W.

By the way, if the opening area of the opening part 71 of the shielding plate 7 is set smaller, good symmetry and coverage can be obtained, but there are cases where the film-forming rate becomes lower. On the other hand, if the opening area of the opening part 71 is set larger, the film-forming rate can be made higher, but there are cases where the symmetry and the coverage become poorer.

As a solution, according to this invention, the amount of increase in the area of the opening part 71 is set depending on the distance between the substrate W and the target 2. Therefore, without impairing the function of being capable of forming the Cu films with good coverage while keeping good symmetry inside the holes and trenches formed on the surface of the substrate W, the Cu films having substantially equal film thicknesses can be formed at high film-forming rate over the entire surfaces of the substrate W. Specifically, in case the opening part 71 has a contour of a sector, provided the radius of the substrate W is defined as r, and the distance between the target 2 and the substrate W is defined as d1, the center of the substrate W is offset so as to be away from the center of the target 2 by r/3 or more, and the area of the opening part 71 is set such that a ratio of shielded area of the substrate W as shielded by the shielding plate 7 is larger than the value of 1−(d1÷2r/2.66). In this case, the central angle of the opening part shall preferably be set in a range of 60° to 120°.

By the way, if a film is formed in the portion around the origin 72 of the opening part 71, there is a case in which the amount of sputtered particles to reach the central region of the substrate W decreases. In this case, by moving the shielding plate 7, by the moving means 8, along the offset direction of the substrate W relative to the center of the target 2, the amount of sputtered particles that reach the central region of the substrate W can be maintained. In this manner, the film thicknesses of the thin films to be formed in the holes and trenches that are present in the central region can be prevented from getting thinner. By the way, the following arrangement may also be employed, i.e., the relationship between the number of processing the substrates W and the amount of film formation on the part in question is obtained in advance, and the shielding plate 7 is moved depending on the number of substrates W that have been processed.

Then, in order to confirm the above-mentioned effects, the following experiments were carried out by using the above-mentioned sputtering apparatus SM. In other words, in these experiments, the substrate W used was a circular silicon substrate of φ300 mm (in diameter) that was formed, on the surface of the silicon substrate, with trenches of an opening width of 50 nm and a depth of 200 nm. The target 2 used had a diameter of φ400 mm (2.66 times the radius r of the substrate W) made of Cu. The distance d1 between the substrate W and the target 2 (hereinafter referred to as a "T/S distance") was set to 400 mm, and the distance d2 between the substrate W and the shielding plate 7 was set to 50 mm, and the offset amount Vo from the center of the target 2 to the center of the substrate W was set to r/2. The shielding plate 7 used was made of stainless steel (SUS) of φ400 mm (in diameter). The shielding plate 7 was formed with an opening part 71 having a contour of a sector with the central angle θ of 90°. Then, the rotational speed of the stage 5 was controlled to 120 rpm and the rotational speed of the magnet unit 3 was controlled to 52 rpm, respectively. Argon gas was introduced into the vacuum chamber 1 and by charging the target with DC power to thereby generate plasma. Thereafter, the flow rate of the argon gas was immediately adjusted to 0 sccm (the pressure in the processing chamber 1a at this time was $1 \times 10^{-5}$ Pa). The DC power to be charged to the target 2 was set to 23 kW and the stage 5 was charged with high-frequency power of 13.56 MHz by 300 W to thereby sputter the target 2 and formed Cu films on the inside of the trenches. Out of the sectional scanning electron microscope (SEM) images of the substrate W after the film formation, evaluation was made of the symmetry and the coverage of the Cu films formed on the inside of the trenches. Together with this, evaluation was made of the film-forming rate out of the values of measurement of the Cu films formed on the flat portion of the surface of the substrate W (the portion other than the trenches). The results of these evaluations are shown in FIG. 3(a) in a lump. FIG. 3(a) also shows the results of evaluation when the central angle θ of the opening part 71 was changed to 45°, 60°, 120°, 150° and 180°, respectively. By the way, in the results of evaluation as shown in FIG. 3, the mark "○" shows the case in which the symmetry and the coverage were superior and also the film-forming rate was high, the mark "Δ" shows the case in which the symmetry and the coverage were superior and the film-forming rate was capable of being applied to mass production, and the mark "▲" shows the case in which the symmetry and the coverage were capable of being applied to mass production and the film-forming rate was high, and the mark "x" shows the case in which the symmetry and the coverage were NG (not capable of being applied to mass production), respectively. FIG. 3(a) also shows the results of evaluation in the case where the T/S distance d1 was changed to 200 mm and 300 mm, respectively.

In case the results of evaluation of "○", "Δ" and "▲" as shown in FIG. 3(a) could be obtained, the conditions can be met in that the ratio of shielded area of the substrate W as shielded by the shielding plate 7 becomes larger than the value 1−(d÷2r/2.66). Confirmation was made of the following, i.e., that: in case the area of the opening part 71 was set so as to meet the above conditions and, for example, the T/S distance d1 was 200 mm, the central angle θ could be made larger up to 90°; if the T/S distance d1 was set to 300 mm, the central angle θ could be increased up to 120°; if the T/S distance d1 was set to 400 mm, the central angle θ could be increased up to 180°. However, in case the coverage performance is definitely required, the central angle θ shall preferably be made below 120° and, further, shall preferably be made above 60° when the productivity is taken into consideration.

FIG. 3(b) shows the results of evaluation in forming Cu films in a similar method as the above, except for the point that a substrate W of φ450 mm (in diameter) was used. In case the evaluation results indicated by the marks "○", "Δ" and "▲" as shown in FIG. 3(b) were obtained, the conditions were met in that the ratio of shielded area of the substrate W as shielded by the shielding plate 7 becomes larger than the value 1−(d÷2r/2.66). The area of the opening part 71 was set so as to meet the above conditions and, for example, in case the T/S distance was 200 mm, the central angle θ was set to 45°. Confirmation was made that: when the T/S distance d1 was set to 300 mm, the central angle θ could be increased up to 60°; when the T/S distance d1 was set to 400 mm, the central angle θ could be increased up to 90°; and in case the T/S distance d1 was set to 600 mm, the central angle θ could be increased up to 180°. However, in case the coverage performance is definitely required, the central angle θ shall preferably be made below 120° and, further, shall preferably be made above 60° when the productivity is taken into consideration.

According to the experiments performed as explained above, it has been found that, if the central angle θ is set depending on the T/S distance d1, the film-forming rate can be made higher without impairing the function in that the film can be formed in good symmetry and with good coverage.

Figure 4:
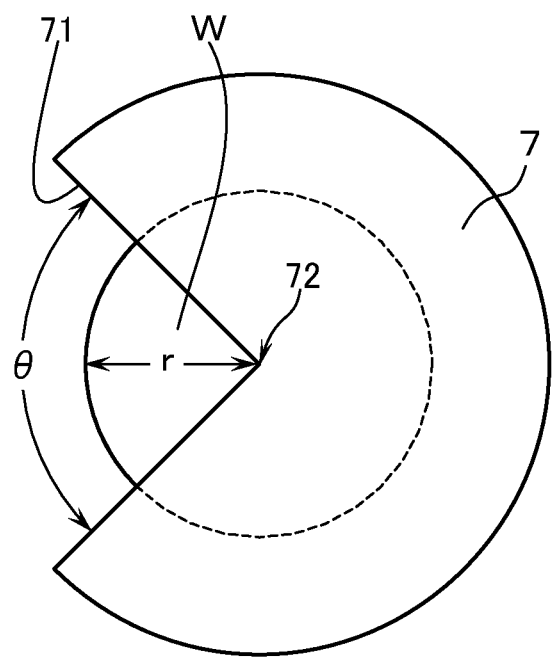
FIG. 4 is a schematic plan view of a modified embodiment of the shielding plate.

Descriptions have so far been made of embodiments of this invention. This invention, however, shall not be limited to the above. For example, as shown in FIG. 4, the opening part 71 of the shielding plate 7 may have been formed as a notched part. In addition, the opening part 71 has a contour in which, with a central region of the substrate serving as an origin, the area of the opening part gradually increases toward the radially outward from the origin. However, this invention shall not be limited to the case where the opening part in the shape of so-called substantially sector shape, or substantially angular shape is disposed at a single part. Instead, an arrangement may be made that a plurality of opening parts are disposed in a scattered manner such that the sum of these opening parts can meet the above-mentioned conditions.

Furthermore, in the above-mentioned embodiments, descriptions have been made of an example in which Cu films were formed on the surface of the substrate W by using the target 2 made of Cu but, without being limited to the above, this invention can be applied to a case in which an electrical insulation film is formed by using a target of electrical insulation matter manufactured in $Al_2O_3$, MgO, SiC, SiN, and the like.

EXPLANATION OF MARKS

SM sputtering apparatus
W substrate
1 vacuum chamber
2 target 2a sputtering surface (surface to be sputtered)
2c center of target 2
3 magnet unit
5 stage
7 shielding plate
71 opening part
72 origin

The invention claimed is:

1. A sputtering apparatus having a vacuum chamber in which a target is disposed and, while a circular substrate disposed inside the vacuum chamber, opposite to the target is rotated at a predetermined rotational speed, with a center of the substrate serving as a center of rotation, the target is sputtered, thereby forming a thin film on a surface of the substrate, the sputtering apparatus comprising:
  a stage for rotatably holding the substrate in a state in which the center of the substrate is offset, relative to the center of the target, by a predetermined distance to radially one side from the center of the target;
  a shielding plate disposed between the target and the substrate on the stage in order to cover the substrate, the shielding plate having formed therein an opening part which allows sputtered particles to pass to a side of the substrate, the sputtered particles being scattered out of the target as a result of sputtering the target at a predetermined discharge pressure,
  wherein the opening part has a shape radially widened from a central region of the substrate serving as an origin towards a circumferential outer edge,
  wherein an amount of increase in an area of the opening part is set depending on a distance between the target and the substrate,
  wherein the target has a same size or larger size than the substrate,
  wherein, provided a radius of the substrate is defined as r and the distance between the target and the substrate is defined as d, the center of the substrate is offset so as to be away from the center of the target by r/3 or more, and
  wherein the area of the opening part is set such that a ratio of shielded area of the substrate as shielded by the shielding plate is larger than a value of $1-(d\div 2r/2.66)$, the sputtering apparatus further comprising moving means for moving the shielding plate along the offset direction of the substrate relative to the center of the target.

2. The sputtering apparatus according to claim 1, wherein a central angle of the opening part is in a range of 60° to 120°.

3. The sputtering apparatus according to claim 1, further comprising:
  a magnet unit disposed on that back side of the target which is opposite to the substrate such that leakage magnetic field outside of the magnet is generated between the target and the substrate and is also unevenly distributed between the center of the target and a peripheral part of the target;
  rotating means for rotating the magnet unit with the center of the target serving as a center of rotation; and
  control means for controlling the rotational speeds of the magnet unit and the stage, respectively, so that the magnet unit and the stage are not synchronized with each other.

4. The sputtering apparatus according to claim 1, wherein the distance between the shielding plate and the substrate is within two times the mean free path of the sputtering particles at the discharge pressure.

5. The sputtering apparatus according to claim 1, wherein the opening part of the shielding plate has kept exposed the central region of the substrate.

6. The sputtering apparatus according to claim 1, wherein the center of the target is offset from a center of the shielding plate.

7. The sputtering apparatus according to claim 1, wherein when viewed in plan, during sputtering, the opening is located partially outside of the substrate and located immediately above the substrate with a gap between the circumferential outer edge of the opening and a peripheral edge of the substrate.

* * * * *